(12) United States Patent
Xie et al.

(10) Patent No.: US 11,848,650 B2
(45) Date of Patent: Dec. 19, 2023

(54) DIFFERENTIAL POWER AMPLIFIER

(71) Applicant: LANSUS TECHNOLOGIES INC., Shenzhen (CN)

(72) Inventors: Zhiyuan Xie, Shenzhen (CN); Yuting Zhao, Shenzhen (CN); Jiashuai Guo, Shenzhen (CN)

(73) Assignee: LANSUS TECHNOLOGIES INC., Shenzhen (CN)

( * ) Notice: Subject to any disclaimer, the term of this patent is extended or adjusted under 35 U.S.C. 154(b) by 0 days.

(21) Appl. No.: 18/132,422

(22) Filed: Apr. 10, 2023

(65) Prior Publication Data
US 2023/0246606 A1   Aug. 3, 2023

Related U.S. Application Data

(63) Continuation of application No. PCT/CN2022/084372, filed on Mar. 31, 2022.

(30) Foreign Application Priority Data

Sep. 16, 2021   (CN) .......................... 202122255557.8

(51) Int. Cl.
*H03F 3/191* (2006.01)
*H03F 3/21* (2006.01)
*H03F 1/56* (2006.01)

(52) U.S. Cl.
CPC .............. *H03F 3/21* (2013.01); *H03F 1/565* (2013.01); *H03F 2200/255* (2013.01); *H03F 2200/387* (2013.01)

(58) Field of Classification Search
CPC .. H03F 3/191; H03F 3/20; H03F 1/30; H03G 3/30
(Continued)

(56) References Cited

U.S. PATENT DOCUMENTS

| 6,762,647 B1 * | 7/2004 | Apel ......................... H03F 1/52 330/285 |
| 11,128,269 B2 * | 9/2021 | Maalouf ............... H03F 1/0227 |

(Continued)

FOREIGN PATENT DOCUMENTS

| CN | 106533374 A | 3/2017 |
| CN | 109167575 A | 1/2019 |

(Continued)

OTHER PUBLICATIONS

International Search Report issued in corresponding International application No. PCT/CN2022/084372, dated Jun. 15, 2022.
(Continued)

*Primary Examiner* — Henry Choe

(57) ABSTRACT

A differential power amplifier includes an input matching network, a first-stage amplification circuit, a first inter-stage matching network, a second-stage amplification circuit, a second inter-stage matching network, a third-stage amplification circuit, and an output matching network. The first-stage amplification circuit and the second-stage amplification circuit are single-ended input single-ended output circuits. The third-stage amplification circuit is a dual input dual output circuit. The second inter-stage matching network includes a first transformer T1, a first capacitor C1, a second capacitor C2, a first inductor L1, and a second inductor L2. The output matching network includes a second transformer T2. The inter-stage matching networks and the output matching network are realized by the first transformer T1 and the second transformer T2, which reduces an inter-stage matching difficulty, optimizes input return loss and gain, and improves output power.

10 Claims, 5 Drawing Sheets

(58) Field of Classification Search
USPC .......................................... 330/302, 296, 285
See application file for complete search history.

(56) References Cited

U.S. PATENT DOCUMENTS

| | | | |
|---|---|---|---|
| 11,515,842 B2* | 11/2022 | Wang | .................... H03F 3/195 |
| 2008/0030276 A1* | 2/2008 | Hau | ........................ H03F 3/19 |
| | | | 455/127.5 |

FOREIGN PATENT DOCUMENTS

| CN | 211063579 U | 7/2020 |
|---|---|---|
| CN | 111934629 A | 11/2020 |

OTHER PUBLICATIONS

Written Opinion of the International Search Authority in corresponding International application No. PCT/CN2022/084372.

* cited by examiner

DIFFERENTIAL POWER AMPLIFIER

TECHNICAL FIELD

The present disclosure relates to a technical field of power amplifiers, and in particular to a differential power amplifier.

BACKGROUND

In a 5G wireless communication system, a key module is a radio frequency (RF) power amplifier arranged at one end of a transmitter. The RF power amplifier is configured to amplify an output signal, and an antenna sends out an amplified signal thereof. The RF power amplifier directly affects and determines the output power, efficiency, gain, linearity, working bandwidth, reflection coefficient, and other performance indicators of the transmitter, thus affecting and determining performance indicators of the 5G wireless communication system. Conventional matching structures in the RF power amplifier are combinations of at least one capacitor and at least one inductor connected in series/parallel, which realize impedance change when an input port and an output port of the RF power amplifier are connected with a 50-ohm port, and thus realizing the maximum gain transmission or maximum power transmission according to needs of different RF power amplifiers. A conventional impedance matching network is mostly a "H-type" matching network, a "T-type" matching network, or an "L-type" matching network, where most suitable matching structures and matching devices thereof are chosen according to different impedance points.

RF power amplifiers applied to 5G mobile communication have larger output power than conventional RF power amplifiers, so more transistors are needed to realize high output power, which increases difficulty of matching. Further, capacitors, inductors, and resistors generate a relatively large parasitic effect at high frequencies, resulting in differences between actual values of above devices and ideal values of the above devices. Thus, impedance matching at high frequencies is more difficult. In practical design, the conventional matching structures using only capacitors and inductors cannot match input return loss and gain to a good state.

SUMMARY

Embodiments of the present disclosure provide a differential power amplifier that reduces matching difficulty, has high gain and output power, and optimizes input return loss.

In order to solve above problems, the present disclosure provides the differential power amplifier. The differential power amplifier comprises an input matching network, a first-stage amplification circuit, a first inter-stage matching network, a second-stage amplification circuit, a second inter-stage matching network, a third-stage amplification circuit, and an output matching network.

The first-stage amplification circuit and the second-stage amplification circuit are single-ended input single-ended output circuits. The third-stage amplification circuit is a dual input dual output circuit. The second inter-stage matching network comprises a first transformer T1, a first capacitor C1, a second capacitor C2, a first inductor L1, and a second inductor L2. The output matching network comprises a second transformer T2.

An input end of the input matching network is connected with a single-ended radio frequency input signal RFin and an output end of the input matching network is connected with an input end of the first-stage amplification circuit. An output end of the first-stage amplification circuit is connected with an input end of the first inter-stage matching network. An output end of the first inter-stage matching network is connected with an input end of the second-stage amplification circuit. A first input end of the first transformer T1 is connected with an output end of the second-stage amplification circuit and a second input end of the first transformer T1 is connected with a power supply voltage Vcc2. The first transformer T1 converts a single-ended signal from the second-stage amplification circuit into a pair of differential signals. The pair of differential signals is respectively input to a first input end and a second input end of the third-stage amplification circuit. A first output end of the third-stage amplification circuit is connected with a first input end of the second transformer T2. A second output end of the third-stage amplification circuit is connected with a second input end of the second transformer T2. A first output end of the second transformer T2 is grounded, and a second output end of the second transformer T2 is configured to output a single-ended radio frequency output signal RFout.

A first end of the first capacitor C1 and a first end of the second capacitor C2 are respectively connected with the first input end of the first transformer T1 and the second input end of the first transformer T1. A second end of the first capacitor C1 and a second end of the second capacitor C2 are respectively grounded. A first end of the first inductor L1 is connected with a first output end of the first transformer T1 and a first end of the second inductor L2 is connected with a second output end of the first transformer T1. A second end of the first inductor L1 and a second end of the second inductor L2 are respectively grounded.

Furthermore, the first-stage amplification circuit comprises a first transistor Q1. The second-stage amplification circuit comprises a second transistor Q2. The third-stage amplification circuit comprises two third transistors Q3.

A base of the first transistor Q1 is connected with the output end of the input matching network. A collector of the first transistor Q1 is connected with the input end of the first inter-stage matching network. An emitter of the first transistor Q1 is grounded. A base of the second transistor Q2 is connected with the output end of the first inter-stage matching network. A collector of the second transistor Q2 is connected with one of the two input ends of the first transformer T1. An emitter of the second transistor Q2 is connected with a ground end of the first transformer T1. Bases of the two third transistors Q3 are respectively connected with the first output end of the first transformer T1 and the second output end of the first transformer T. Collectors of the two third transistors Q3 are respectively connected with the first input end of the second transformer T2 and the second input end of the second transformer T2. Emitters of the two third transistors Q3 are respectively grounded.

Furthermore, the differential power amplifier further comprises a negative feedback network connected between the collector of the first transistor Q1 and the base of the first transistor Q1. The negative feedback network comprises a first resistor R1 and a third capacitor C3. The first resistor R1 and the third capacitor C3 are connected in series.

The first-stage amplification circuit further comprises a second resistor R2 connected between the input matching network and the base of the first transistor Q1. The input matching network, the second resistor R2, and the base of the first transistor Q1 are connected in series. The second resistor R2 is connected in parallel with the negative feedback network.

Furthermore, the second inter-stage matching network further comprises a fourth capacitor C4, a fifth capacitor C5, and a third inductor L3.

The fourth capacitor C4 is connected between the first output end of the first transformer T1 and a base of a first one of the third transistors Q3. The first transformer T1, the fourth capacitor C4, and the first one of the third transistors Q3 are connected in series. The fifth capacitor C5 is connected between the second output end of the first transformer T1 and a base of a second of the third transistors Q3. The first transformer T1, the fifth capacitor C5, and the second one of the third transistors Q3 are connected in series. The third inductor L3 is connected between the second input end of the first transformer T1 and the power supply voltage Vcc2. The first transformer T1, the third inductor L3 and the power supply voltage Vcc2 are connected in series.

Furthermore, the output matching network further comprises a sixth capacitor C6, a seventh capacitor C7, an eighth capacitor C8, and a fourth inductor L4.

A first end of the sixth capacitor C6 is connected with the first input end of the second transformer T2 and a first end of the seventh capacitor C7 is connected with the second input end of the second transformer T2. A second end of the sixth capacitor C6 and a second end of the seventh capacitor C7 are respectively grounded. A first end of the eighth capacitor C8 is connected with the first output end of the second transformer T2; a second end of the eighth capacitor C8 is grounded. The fourth inductor L4 is connected between the first output end of the second transformer T2 and a ground end. The second transformer T2, the fourth inductor L4, and the ground end are connected in series.

Furthermore, the input matching network comprises a ninth capacitor C9, a tenth capacitor C10, a fifth inductor L5, and a sixth inductor L6.

A first end of the ninth capacitor C9 is connected with a first end of the fifth inductor L5, and a connection node thereof is configured to input the single-ended radio frequency input signal RFin. A second end of the fifth inductor L5 is grounded. A second end of the ninth capacitor C9 is connected with a first end of the tenth capacitor C10. A second end of the tenth capacitor C10 is connected with the input end of the first-stage amplification circuit, a first end of the sixth inductor L6 is connected between the ninth capacitor C9 and the tenth capacitor C10, and a second end of the sixth inductor L6 is grounded.

Furthermore, the second-stage amplification circuit further comprises a third resistor R3. The third resistor R3 is connected between the output end of the first inter-stage matching network and the input end of the second-stage amplification circuit. The first inter-stage matching network, the third resistor R3, and the second-stage amplification circuit are connected in series.

Furthermore, the differential power amplifier further comprises base bias circuits one-to-one connected with the base of the first transistor Q1, the base of the second transistor Q2, the base of the first one of the third transistors Q3, and the base of the second one of the third transistors Q3.

Each of the base bias circuits comprises a fourth transistor Q4, a fifth transistor Q5, a sixth transistor Q6, a fourth resistor R4, a fifth resistor R5, a sixth resistor R6, and an eleventh capacitor C11.

In each of the base bias circuits, a base of the fourth transistor Q4 thereof, a collector of the fourth transistor Q4 thereof, a base of the fifth transistor Q5 thereof, a first end of the fourth resistor R4 thereof, and a first end of the eleventh capacitor C11 thereof are connected, a second end of the fourth resistance R4 thereof is connected with a power supply voltage Vreg, an emitter of the fourth transistor Q4 thereof, a base of the sixth transistor Q6 thereof, and a collector of the sixth transistor Q6 thereof are connected, an emitter of the sixth transistor Q6 thereof is connected with a first end of the fifth resistance R5 thereof, a second end of the fifth resistance R5 thereof is grounded, a second end of the eleventh capacitor C11 thereof is grounded, a collector of the fifth transistor Q5 thereof is connected with the power supply voltage Vbat thereof, an emitter of the fifth transistor Q5 thereof is connected with a first end of the sixth resistance R6 thereof, and a second end of the sixth resistance R6 thereof is connected with the base of a corresponding transistor.

Furthermore, the first inter-stage matching network comprises a seventh inductor L7, an eighth inductor L8, a fourteenth capacitor C14, and a fifteenth capacitor C15.

A first end of the seventh inductor L7 and a first end of the fourteenth capacitor C14 are connected with the output end of the first-stage amplification circuit. A second end of the seventh inductor L7 is connected with a power supply voltage Vcc1, a second end of the fourteenth capacitor C14, a first end of the eighth inductor L8, and a first end of the fifteenth capacitor C15 are connected. A second end of the fifteenth capacitor C15 is connected with the input end of the second-stage amplification circuit. A second end of the eighth inductor L8 is grounded.

Furthermore, the first transformer T1 and the second transformer T2 are symmetrical interwinding transformers.

In the present disclosure, the differential power amplifier comprises the input matching network, the first-stage amplification circuit, the first inter-stage matching network, the second-stage amplification circuit, the second inter-stage matching network, the third-stage amplification circuit, and the output matching network.

The second inter-stage matching network comprises the first transformer T1, the first capacitor C1, the second capacitor C2, the first inductor L1, and the second inductor L2. The output matching network comprises the second transformer T2.

An input end of the input matching network is connected with a single-ended radio frequency input signal RFin and an output end of the input matching network is connected with an input end of the first-stage amplification circuit. An output end of the first-stage amplification circuit is connected with an input end of the first inter-stage matching network. An output end of the first inter-stage matching network is connected with an input end of the second-stage amplification circuit. A first input end of the first transformer T1 is connected with the first end of the first capacitor C1 and a second input end of the first transformer T1 is connected with the second end of the second capacitor C2. The second end of the first capacitor C1 and the second end of the second capacitor C2 are respectively grounded. The first end of the first inductor L1 is connected with the first output end of the first transformer T1 and the first end of the second inductor L2 is connected with the second output end of the first transformer T1. The second end of the first inductor L1 and the second end of the second inductor L2 are respectively grounded.

The difficulty of inter-stage matching is effectively reduced by the first transformer T1 in the second inter-stage matching network and the second transformer T2 in the output matching network, thus effectively optimizing the input return loss and gain, and improving the output power. Moreover, through the first capacitor C1, the second capacity C2, the first inductor L1, and the second inductor L2, a matching bandwidth of the first transformer T1 is increased and mating insertion loss of the first transformer T1 is reduced.

BRIEF DESCRIPTION OF DRAWINGS

Technical solutions and effects of the present disclosure will be made obvious by the following detailed description of specific embodiments of the present disclosure, in conjunction with the accompanying drawings.

DETAILED DESCRIPTION

Figure 1:
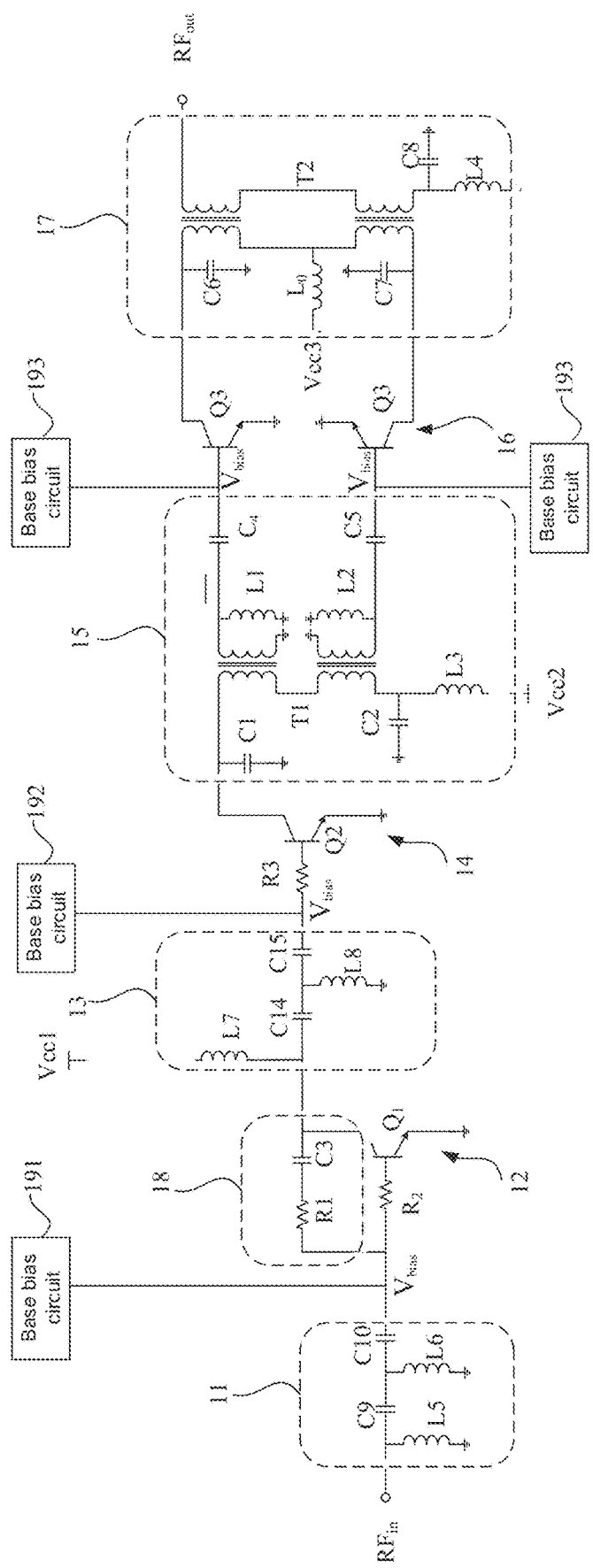
FIG. 1 is a circuit schematic diagram of a differential power amplifier according to one embodiment of the present disclosure.

As shown in the drawings, the same symbols represent the same components. A principle of the present disclosure is illustrated by implementation in an appropriate computing environment. The following description is based on the specific embodiments of the present disclosure illustrated and should not be considered as limitations of other specific embodiments of the present disclosure not detailed herein.

As shown in FIG. 1, in one embodiment, the present disclosure provides a differential power amplifier 100. The differential power amplifier 100 comprises an input matching network 11, a first-stage amplification circuit 12, a first inter-stage matching network 13, a second-stage amplification circuit 14, a second inter-stage matching network 15, a third-stage amplification circuit 16, and an output matching network 17.

The first-stage amplification circuit 12 and the second-stage amplification circuit 14 are single-ended input single-ended output circuits. That is, the first-stage amplification circuit 12 and the second-stage amplification circuit 14 are circuits including one input end and one output end. The third-stage amplification circuit 16 is a dual input dual output circuit. The second inter-stage matching network 15 comprises a first transformer T1, a first capacitor C1, a second capacitor C2, a first inductor L1, and a second inductor L2. The output matching network comprises a second transformer T2.

An input end of the input matching network 11 is connected with a single-ended radio frequency input signal RFin and an output end of the input matching network 11 is connected with an input end of the first-stage amplification circuit 12. An output end of the first-stage amplification circuit 12 is connected with an input end of the first inter-stage matching network 13. An output end of the first inter-stage matching network 13 is connected with an input end of the second-stage amplification circuit 14. A first input end of the first transformer T1 is connected with an output end of the second-stage amplification circuit 14 and a second input end of the first transformer T1 is connected with a power supply voltage Vcc2. The first transformer T1 converts a single-ended signal from the second-stage amplification circuit 14 into a pair of differential signals. The pair of differential signals is respectively input to a first input end and a second input end of the third-stage amplification circuit 16. A first output end of the third-stage amplification circuit 16 is connected with a first input end of the second transformer T2. A second output end of the third-stage amplification circuit 16 is connected with a second input end of the second transformer T2. A first output end of the second transformer T2 is grounded, and a second output end of the second transformer T2 is configured to output a single-ended radio frequency output signal RFout.

A first end of the first capacitor C1 and a first end of the second capacitor C2 are respectively connected with the first input end of the first transformer T1 and the second input end of the first transformer T1. A second end of the first capacitor C1 and a second end of the second capacitor C2 are respectively grounded. A first end of the first inductor L1 is connected with a first output end of the first transformer T1 and a first end of the second inductor L2 is connected with a second output end of the first transformer T1. A second end of the first inductor L1 and a second end of the second inductor L2 are respectively grounded. The first inductor L1 and the second inductor L2 are identical inductive elements having the same size.

In the embodiment of the present disclosure, the differential power amplifier 100 is realized by three amplification circuits, which results in high gain of the differential power amplifier. The difficulty of inter-stage matching is effectively reduced by the first transformer T1 in the second inter-stage matching network and the second transformer T2 in the output matching network, thus effectively optimizing input return loss and the gain and improving output power. Moreover, through the first capacitor C1, the second capacity C2, the first inductor L1, and the second inductor L2, a matching bandwidth of the first transformer T1 is increased and mating insertion loss of the first transformer T1 is reduced.

In some embodiments of the present disclosure, transistors applied to the first-stage amplification circuit 12, the second-stage amplification circuit 14, and the third-stage amplification circuit 16 are heterojunction bipolar transistor (HBT). Of course, in other embodiments, other processes can be used. For example, amplification circuits at all stages may also be realized by using complementary MOS (COMS) transistors, high electron mobility transistor (HEMT), or pseudomorphic HEMT (pHEMT) transistors Taking the HBT transistors as an example, the first-stage amplification circuit 12 comprises a first transistor Q1. The second-stage amplification circuit 14 comprises a second transistor Q2. The third-stage amplification circuit 16 comprises two third transistors Q3.

A base of the first transistor Q1 is connected with the output end of the input matching network 11. A collector of the first transistor Q1 is connected with the input end of the first inter-stage matching network 13. An emitter of the first transistor Q1 is grounded. A base of the second transistor Q2 is connected with the output end of the first inter-stage matching network 13. A collector of the second transistor Q2 is connected with the first end of the first transformer T1. An emitter of the second transistor Q2 is grounded. Bases of the two third transistors Q3 are respectively connected with the first output end of the first transformer T1 and the second output end of the first transformer T1. Collectors of the two third transistors Q3 are respectively connected with the first input end of the second transformer T2 and the second input end of the second transformer T2. Emitters of the two third transistors Q3 are respectively grounded.

Furthermore, the differential power amplifier further comprises a negative feedback network 18 connected between the collector of the first transistor Q1 and the base of the first transistor Q1. The negative feedback network 18 comprises a first resistor R1 and a third capacitor C3. The first resistor R1 and the third capacitor C3 are connected in series. The first-stage amplification circuit 12 further comprises a second resistor R2 connected between the input matching network and the base of the first transistor Q1. The input matching network, the second resistor R2, and the base of the first transistor Q1 are connected in series. The second resistor R2 is connected in parallel with the negative feedback network 18. Thus, by connecting the second resistor R2 with a small resistance value in series with the base of the first transistor Q1, by connecting the negative feedback network 18 between the collector of the first transistor Q1 and the base of the first transistor Q1, and by adjusting a feedback depth by the first resistor R1, gain and output power of the first-stage amplification circuit 12 are reduced while increasing stability thereof.

As shown in FIG. 1, in the embodiment of the present disclosure, the first transistor Q1 is applied to realize the first-stage amplification circuit 12. Of course, in other embodiments, the number of the first transistors Q1 is not limited to one, and a plurality of first transistors Q1 connected in parallel may be used to make the first-stage amplification circuit 12. The plurality of first transistors Q1 are connected in parallel, i.e., bases of the plurality of first transistors Q1 are respectively connected with the second resistor R2 in series, the bases of the plurality of first transistors Q1 are connected in parallel, collectors of the plurality of first transistors Q1 are connected in parallel as the output end of the first-stage amplification circuit 12, and emitters of the plurality of first transistors Q1 are grounded. Similarly, as shown in FIG. 1 in the embodiment of the present disclosure, the second-stage amplification circuit 14 adopts the second transistor Q2 to make one amplification circuit. Of course, in other embodiments, a plurality of second transistors Q2 connected in parallel may be used to make the second-stage amplification circuit 14. Bases of the plurality of second transistors Q2 connected in parallel are connected in parallel, collectors of the plurality of second transistors Q2 are connected in parallel, and emitters of the plurality of second transistors Q2 are grounded. In addition, the third-stage amplification circuit 16 uses two third transistors Q3 to make two amplification circuits. In other embodiments, a plurality of third transistors Q3 connected in parallel may be used to make each of the two amplification circuits. In each of the two amplification circuits, bases of the plurality of third transistors Q3 connected in parallel are connected in parallel, collectors of the plurality of third transistors Q3 are connected in parallel, and emitters of the plurality of third transistors Q3 are grounded.

Furthermore, the second inter-stage matching network 15 further comprises a fourth capacitor C4, a fifth capacitor C5, and a third inductor L3. The fourth capacitor C4 is connected between the first output end of the first transformer T1 and a base of a first one of the third transistors Q3. The first transformer T1, the fourth capacitor C4, and the first one of the third transistors Q3 are connected in series. The fifth capacitor C5 is connected between the second output end of the first transformer T1 and a base of a second one of the third transistors Q3. The first transformer T1, the fifth capacitor C5, and the second one of the third transistors Q3 are connected in series. The third inductor L3 is connected between the second input end of the first transformer T1 and the power supply voltage Vcc2. The first transformer T1, the third inductor L3 and the power supply voltage Vcc2 are connected in series. The fourth capacitor C4 and the fifth capacitor C5 are stopping capacitors, which are identical capacitive elements having the same size, and are configured to adjust gain of the third-stage amplification circuit 16.

Furthermore, the output matching network 17 further comprises a sixth capacitor C6, a seventh capacitor C7, an eighth capacitor C8, and a fourth inductor L4.

A first end of the sixth capacitor C6 is connected with the first input end of the second transformer T2 and a first end of the seventh capacitor C7 is connected with a second input end of the second transformer T2. A second end of the sixth capacitor C6 and a second end of the seventh capacitor C7 are respectively grounded. A first end of the eighth capacitor C8 is connected with the first output end of the second transformer T2; a second end of the eighth capacitor C8 is grounded. The fourth inductor L4 is connected between the first output end of the second transformer T2 and a ground end. The second transformer T2, the fourth inductor L4, and the ground end are connected in series.

In order to optimize input return loss of the overall circuit, the input matching network 11 is realized by two-order LC matching, that is, inductors connected in parallel and grounded and capacitors connected in series form a high-pass matching structure, which increases the stability of the first-stage amplification circuit 12 while reducing the gain and the output power thereof. Specifically, the input matching network 11 comprises a ninth capacitor C9, a tenth capacitor C10, a fifth inductor L5, and a sixth inductor L6.

A first end of the ninth capacitor C9 is connected with a first end of the fifth inductor L5, and a connection node thereof is configured to input the single-ended radio frequency input signal RFin. A second end of the fifth inductor L5 is grounded. A second end of the ninth capacitor C9 is connected with a first end of the tenth capacitor C10. A second end of the tenth capacitor C10 is connected with a first end of the second resistor R2. That is, the second resistor R2 is connected in series between the tenth capacitor C10 and the base of the first transistor Q1. A first end of the sixth inductor L6 is connected between the ninth capacitor C9 and the tenth capacitor C10, and a second end of the sixth inductor L6 is grounded.

Furthermore, the second-stage amplification circuit 14 further comprises a third resistor R3. The first inter-stage matching network 13 is realized by two-order LC matching, which is also a high-pass matching structure. Specifically, the first inter-stage matching network 13 comprises a seventh inductor L7, an eighth inductor L8, a fourteenth capacitor C14, and a fifteenth capacitor C15. A first end of the seventh inductor L7 and a first end of the fourteenth capacitor C14 are connected with the collector of the first transistor Q1. A second end of the seventh inductor L7 is connected with a power supply voltage Vcc1. The seventh inductor L7 is a choke inductor. A second end of the fourteenth capacitor C14, a first end of the eighth inductor L8, and a first end of the fifteenth capacitor C15 are connected. A second end of the fifteenth capacitor C15 is connected with a first end of the third resistor R3. A second end of the third resistor R3 is connected with the base of the second transistor Q2. A second end of the eighth inductor L8 is grounded. Through the first inter-stage matching network 13 and the third resistor R3, the stability of the second-stage amplification circuit 14 is further improved and the input return loss is optimized. Moreover, to ensure a low value of error vector magnitude (EVM) of the overall circuit, the output power of the second-stage amplification circuit 14 has a large margin, making the power at the 1 dB power compression point of the second-stage amplification circuit is about 4 dBm greater than an input power required for the third-stage amplification circuit 16.

The power supply voltage Vcc1 and the power supply voltage Vcc2 are configured to supply power to corresponding devices, and a voltage of power supply voltage Vcc1 may be the same as or different from a voltage of the power supply voltage Vcc2, which can be selected according to actual needs.

The differential power amplifier 100 further comprises base bias circuits one-to-one connected with the base of the first transistor Q1, the base of the second transistor Q2, the base of the first one of the third transistors Q3, and the base of the second one of the third transistor Q3. That is, the base of the first transistor Q1 is connected with a first base bias circuit 191, the base of the second transistor Q2 is connected with a second base bias circuit 193, each of the third transistor Q3 is connected with a corresponding third base bias circuit 193. Each of the base bias circuits is configured to provide a bias voltage for the base of a corresponding transistor. Structures of the first base bias circuit 191, the second base bias circuit 192, and each of the third base bias circuits 193 may be the same or different. In the embodiment, all of the base bias circuits having the same circuit structure.

Figure 2:
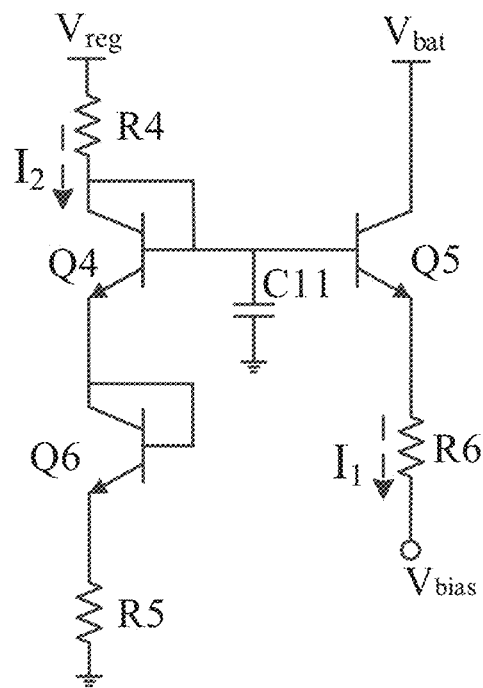
FIG. 2 is a circuit schematic diagram of a base bias circuit according to one embodiment of the present disclosure.

As shown in FIG. 2, each of the base bias circuits comprises a fourth transistor Q4, a fifth transistor Q5, a sixth transistor Q6, a fourth resistor R4, a fifth resistor R5, a sixth resistor R6, and an eleventh capacitor C11.

In each of the base bias circuits, a base of the fourth transistor Q4 thereof, a collector of the fourth transistor Q4 thereof, a base of the fifth transistor Q5 thereof, a first end of the fourth resistor R4 thereof, and a first end of the eleventh capacitor C11 thereof are connected, a second end of the fourth resistance R4 thereof is connected with a power supply voltage Vreg. In each of the base bias circuits, an emitter of the fourth transistor Q4 thereof, a base of the sixth transistor Q6 thereof, and a collector of the sixth transistor Q6 thereof are connected, an emitter of the sixth transistor Q6 thereof is connected with a first end of the fifth resistance R5 thereof, a second end of the fifth resistance R5 thereof is grounded, a second end of the eleventh capacitor C11 thereof is grounded, a collector of the fifth transistor Q5 thereof is connected with the power supply voltage Vbat thereof, an emitter of the fifth transistor Q5 thereof is connected with a first end of the sixth resistance R6 thereof, and a second end of the sixth resistance R6 thereof is connected with the base of a corresponding transistor.

Each fourth resistor R4 and each fifth resistor R5 are voltage divider resistors, each sixth resistor R6 is a thermal effect suppression resistor, $I_1$ and $I_2$ in each of the base bias circuits are currents, and each eleventh capacitor C11 is a filter capacitor. Each fourth transistor Q4 and a corresponding sixth transistor Q6 form a clamp voltage, making a corresponding current $I_2$ a stable current. By adjusting resistance values of each fourth resistor R4 and a corresponding fifth resistor R5, a value of corresponding current $I_2$ is adjusted. Each fourth transistor Q4 and the corresponding fifth transistor Q5 form a current mirror. Due to an amplification function of each fifth transistor Q5, a current of the emitter of each fifth transistor Q5 is mirrored and amplified. Since $I_2$ in each of the base bias circuits is a stable current, $I1=\beta I2$.

Taking the first base bias circuit 191 connected with the first transistor Q1 as an example, when an input power increases and the differential power amplifier is in a high-power working state, the direct current (DC) of the first transistor Q1 increases and a potential of the base of the first transistor Q1 drops due to the self-heating effect and the diode rectification characteristic of the transistors, so a signal on a RF line leaks into the first base bias circuit 191. Due to a subsistent of the capacitor C11 thereof, the signal sequentially passes through the emitter of the fifth transistor Q5 thereof, the base of the fifth transistor Q5 thereof, and the capacitor C11 thereof, and is finally grounded. Therefore, the potential of the base of the fifth transistor Q5 thereof remains constant, so linearity of the differential power amplifier is effectively improved. A voltage between the base and the emitter of the fifth transistor Q5 thereof is reduced due to rectification. Since the potential of the base of the fifth transistor Q5 thereof remains constant, reduction of a voltage of the base of the first transistor Q1 is effectively compensated, so that the first transistor Q1 keeps a static working point unchanged in a high input power state and a high output power state, and therefore gain compression is effectively suppressed.

Figure 3:
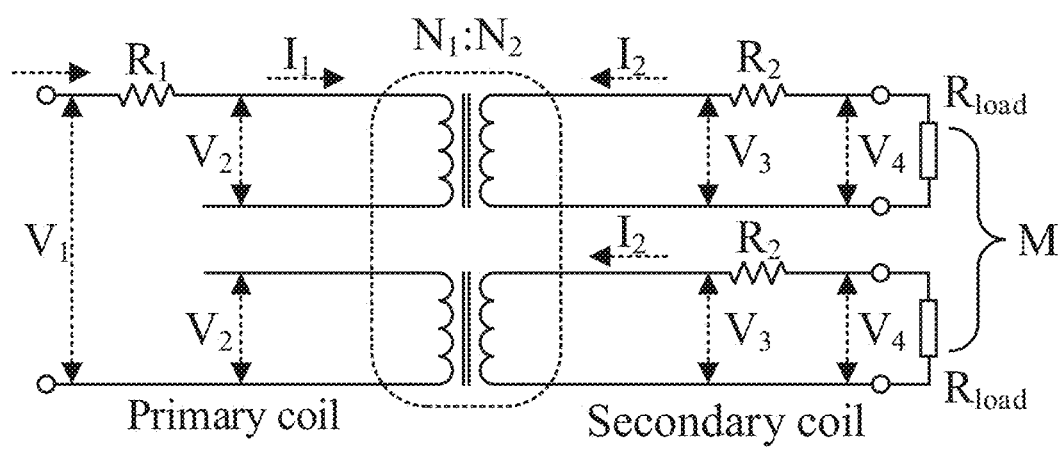
FIG. 3 is a schematic diagram showing a principle of a symmetrical interwinding transformer according to one embodiment of the present disclosure.
Figure 4:
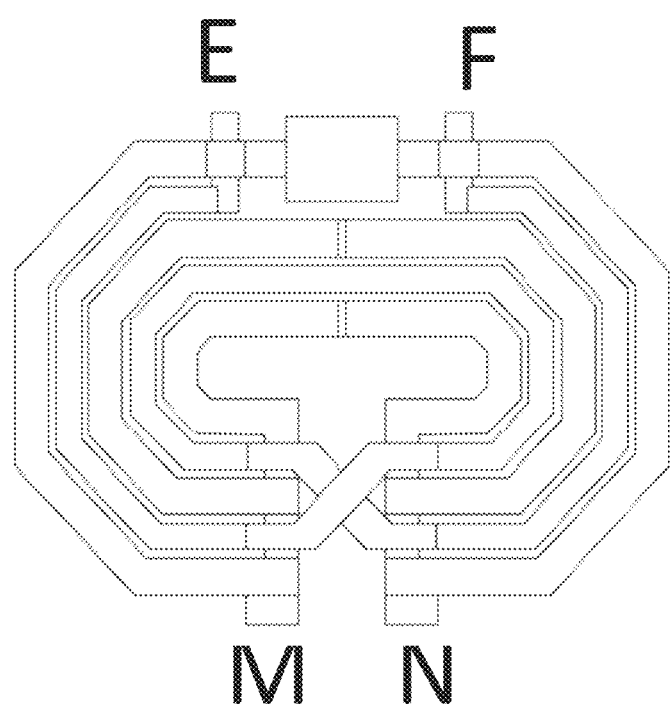
FIG. 4 is a layout of the symmetrical interwinding transformer according to one embodiment of the present disclosure.

As shown in FIGS. 3 and 4, the first transformer T1 and the second transformer T2 are symmetrical interwinding transformers. A grounding point of each of the symmetrical interwinding transformers is on a symmetry axis thereof, which ensures that a phase of an output signal is sufficiently accurate during phase conversion and has a great advantage in transmitting the pair of differential signals. In addition, each of the symmetrical interwinding transformers has a large mutual inductance, so a coupling coefficient K is large and is in a range of 0.7-0.9. The greater the coupling coefficient K, the closer each of the symmetrical interwinding transformers is to an ideal state, the wider the bandwidth thereof is, and the smaller an insertion loss thereof is. Ports of a primary coil and a secondary coil of each of the symmetrical interwinding transformers are disposed on two ends of each of the symmetrical interwinding transformers, so the primary coil and the secondary coil are very suitable for cascade connection of two adjacent circuits. For example, taking the first transformer T1 as an example, an E end and an F end of the first transformer T1 are respectively connected with the output end of the second transistor Q2 and an isolation end of the second transistor Q2 (i.e., the DC supply terminal Vcc2). The E end and the F end of the first transformer T1 and a connecting coil thereof form the primary coil. An M end and an N end of the first transformer T1 are connected with the input ends of the pair of differential signals of the third-stage amplification circuit. The M end and the N end of the first transformer T1 and a connecting coil thereof form the secondary coil. A turns ratio of the primary coil and secondary coil is in a range of 2:1-1:1.

Each transformer of the embodiment of the present disclosure is realized by three layers of stacked metal layers. The primary coil of each transformer is realized by a second later of the stacked metal layers, and the secondary coil is realized by the first and third layers of the stacked metal layers.

Figure 5:
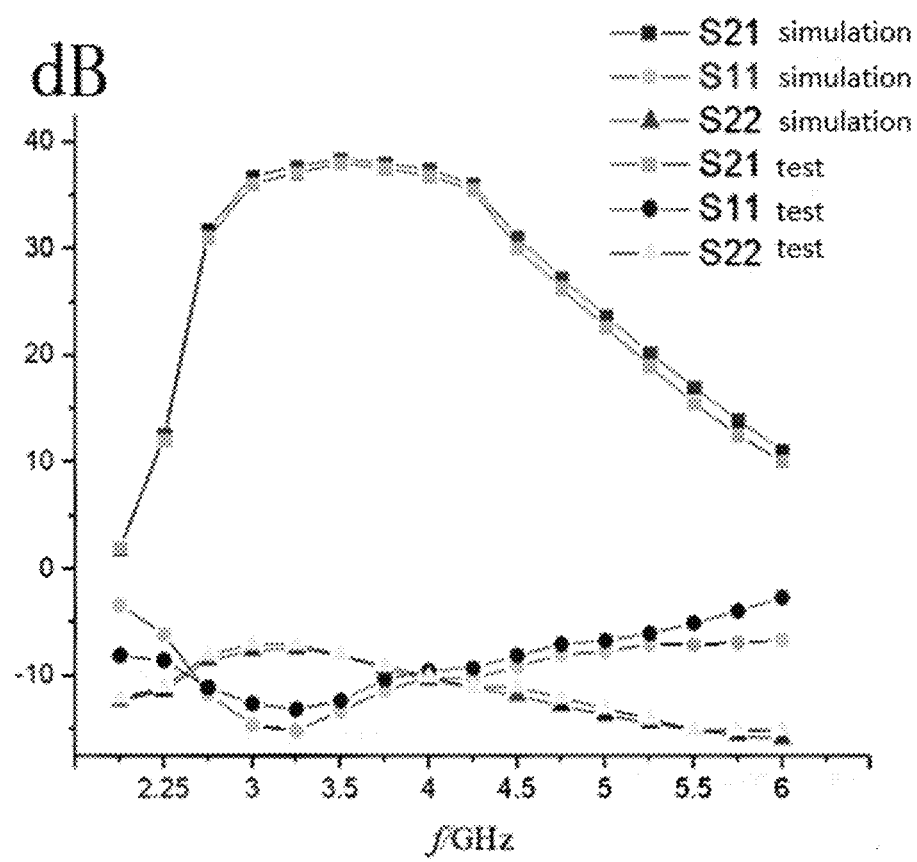
FIG. 5 is a schematic diagram showing simulation oscillograms and test oscillograms of small signals of the differential power amplifier according to one embodiment of the present disclosure.

FIG. 5 is a schematic diagram showing simulation oscillograms and test oscillograms of small signals of the differential power amplifier according to one embodiment of the present disclosure. The small signals comprises an input return loss S11, a gain S21, and an output return loss S22, i.e., FIG. 5 shows simulation oscillograms and test oscillograms of the input return loss S11, the gain S21, and the output return loss S22. A simulation condition and a test conditions are 5 V for each power supply voltage Vcc (including power supply voltages Vcc1~Vcc3), 4.2 V for each power supply voltage Vbat in each of the base bias circuits, 2.8 V for the power supply voltage Vreg in the first base bias circuit 191, 3 V for power supply voltage Vreg in the second base bias circuit 192, and 3 V for the power supply voltage Vreg in each of the third base bias circuits 193. In all stages of quiescent current, a first-stage quiescent current ICC1 is 20.5 mA, a second-stage quiescent current ICC2 is 82.7 mA, and a third-stage quiescent current ICC3 is 268 mA. At a working frequency of 3.3-4.2 GHz, a simulation result of the gain S21 is 36.5-38.5 dB, and a test result of the gain S21 is 36-38 dB, that is, the gain reaches an expected target, and the overall circuit realizes high gain. A simulation result of the input return loss S11 is −15 dB to −11 dB, and a test result of the input return loss S11 is −13 dB to −10.2 dB. The input return loss S11 of the N77 working full-band is less than −10 dB, so a circuit matching result is good, and the test result thereof is close to the simulation result thereof. The output return loss S22 is relatively poor, a simulation result of the output return loss S22 is −7.5 to −11 dB, and a test result of the output return loss S22 is −7 to −10.5 dB, so good input return loss and gain are obtained.

Figure 6:
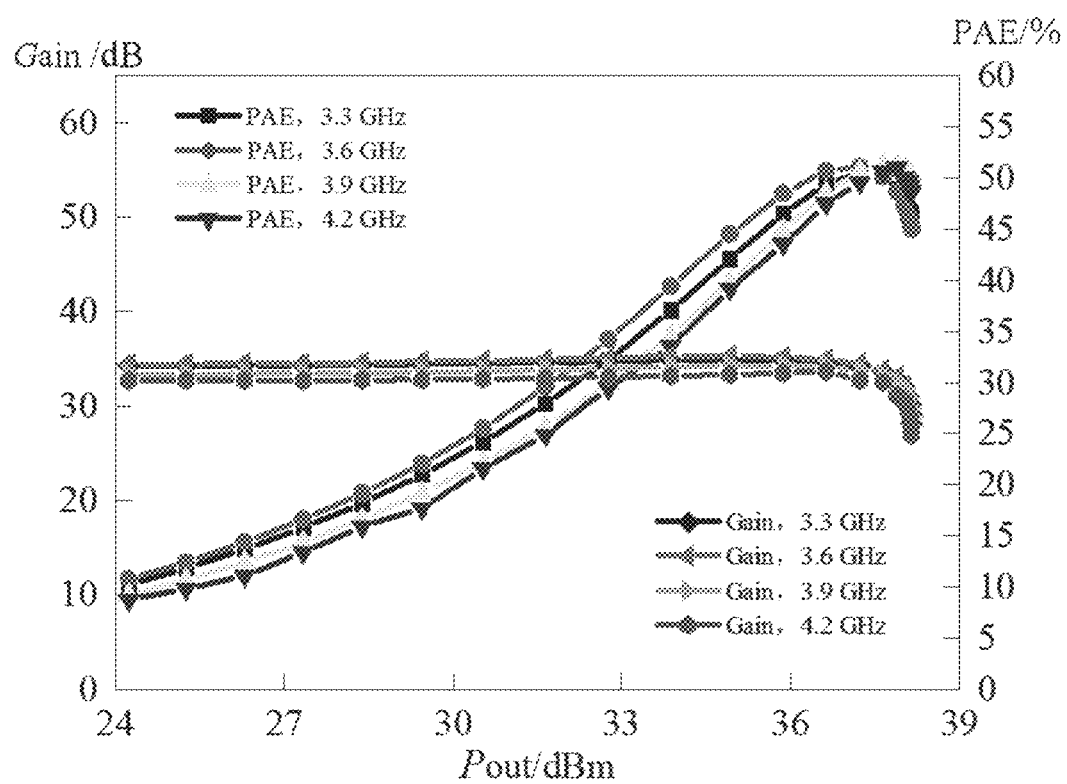
FIG. 6 is a schematic diagram showing simulation oscillograms and test oscillograms of big signals of the differential power amplifier according to one embodiment of the present disclosure.

As shown in FIG. 6, FIG. 6 is a schematic diagram showing simulation oscillograms and test oscillograms of big signals of the differential power amplifier according to one embodiment of the present disclosure. The large signals comprise output power and power added efficiency (efficiency), etc. In the oscillograms shown in FIG. 6, a left vertical coordinate "Gain" represents the gain, a right vertical coordinate "PAE" represents the power added efficiency, and a horizontal coordinate "Pout" represents the output power. From the oscillograms, it is indicated that P1 dB (the compression points of 1 dB) of four frequency points at 3.3 Ghz, 3.6 GHz, 3.9 GHz, and 4.2 GHz is greater than 37 dBm, and the PAE of the P1 dB points (1 dB power compression points) of four frequency points is greater than 45%. The gain compression curve in FIG. 6 increases about 1 dBm from each of the P1 dB points to a saturation power point thereof, and each gain decreases rapidly within 1 dB after the output power reaches the P1 dB point thereof. Therefore, the differential power amplifier has a good output power performance and a large output linear power. The differential power amplifier of the present disclosure adopts AB type static working point, which obtains high efficiency.

In addition, according to experimental data, it is noted that when the output power is 29 dBm, a test result of an adjacent channel leakage ratio (ACLR) of a left sideband is −42.5 dBc and a test result of the ACLR of a right sideband is −42.3 dBc, which meets design requirements.

The differential power amplifier of the present disclosure makes inter-stage matching and overall matching with good input return loss. The differential power amplifier has high gain, high output power, and high efficiency, and the ACLR of the differential power amplifier is suitable. The ACLR is less than −42 dBc at an output power of 29 dBm, and a chip area is reduced by using each transformer for inter-stage matching, which makes an area of the differential power amplifier less than 1 mm².

The above embodiments of the present disclosure provide a detailed illustration to the differential power amplifier. In the present disclosure, specific embodiments are applied to illustrate the principles and implementations of the present disclosure. The above description of the embodiments is only used to better understand methods and core ideas of the present disclosure. Meanwhile, according to the ideas of the present disclosure, changes are made in the specific implementations and the application scope by those skilled in the art. Therefore, the contents of the specification should not be regarded as a limitation of the present disclosure.

What is claimed is:

1. A differential power amplifier, comprising: an input matching network, a first-stage amplification circuit, a first inter-stage matching network, a second-stage amplification circuit, a second inter-stage matching network, a third-stage amplification circuit, and an output matching network;
    wherein the first-stage amplification circuit and the second-stage amplification circuit are single-ended input single-ended output circuits; the third-stage amplification circuit is a dual input dual output circuit; the second inter-stage matching network comprises a first transformer T1, a first capacitor C1, a second capacitor C2, a first inductor L1, and a second inductor L2; the output matching network comprises a second transformer T2;
    wherein an input end of the input matching network is connected with a single-ended radio frequency input signal RFin and an output end of the input matching network is connected with an input end of the first-stage amplification circuit; an output end of the first-stage amplification circuit is connected with an input end of the first inter-stage matching network; an output end of the first inter-stage matching network is connected with an input end of the second-stage amplification circuit; a first input end of the first transformer T1 is connected with an output end of the second-stage amplification circuit and a second input end of the first transformer T1 is connected with a power supply voltage Vcc2; the first transformer T1 converts a single-ended signal from the second-stage amplification circuit into a pair of differential signals; the pair of differential signals is respectively input to a first input end and a second input end of the third-stage amplification circuit; a first output end of the third-stage amplification circuit is connected with a first input end of the second transformer T2; a second output end of the third-stage amplification circuit is connected with a second input end of the second transformer T2; a first output end of the second transformer T2 is grounded, and a second output end of the second transformer T2 is configured to output a single-ended radio frequency output signal RFout;
    wherein a first end of the first capacitor C1 and a first end of the second capacitor C2 are respectively connected with the first input end of the first transformer T1 and the second input end of the first transformer T1; a second end of the first capacitor C1 and a second end of the second capacitor C2 are respectively grounded; a first end of the first inductor L1 is connected with a first output end of the first transformer T1 and a first end of the second inductor L2 is connected with a second output end of the first transformer T1; a second end of the first inductor L1 and a second end of the second inductor L2 are respectively grounded.

2. The differential power amplifier according to claim 1, wherein the first-stage amplification circuit comprises a first transistor Q1; the second-stage amplification circuit comprises a second transistor Q2; the third-stage amplification circuit comprises two third transistors Q3;
    wherein a base of the first transistor Q1 is connected with the output end of the input matching network; a collector of the first transistor Q1 is connected with the input end of the first inter-stage matching network; an emitter of the first transistor Q1 is grounded; a base of the second transistor Q2 is connected with the output end of the first inter-stage matching network; a collector of the second transistor Q2 is connected with a first input end of the first transformer T1; an emitter of the second transistor Q2 is grounded; bases of the two third transistors Q3 are respectively connected with the first output end of the first transformer T1 and the second output end of the first transformer T1; collectors of the two third transistors Q3 are respectively connected with the first input end of the second transformer T2 and the second input end of the second transformer T2; emitters of the two third transistors Q3 are respectively grounded.

3. The differential power amplifier according to claim 2, wherein the differential power amplifier further comprises a negative feedback network connected between the collector of the first transistor Q1 and the base of the first transistor Q1; the negative feedback network comprises a first resistor R1 and a third capacitor C3; the first resistor R1 and the third capacitor C3 are connected in series;
wherein the first-stage amplification circuit further comprises a second resistor R2 connected between the input matching network and the base of the first transistor Q1; the input matching network, the second resistor R2, and the base of the first transistor Q1 are connected in series; the second resistor R2 is connected in parallel with the negative feedback network.

4. The differential power amplifier according to claim 2, wherein the second inter-stage matching network further comprises a fourth capacitor C4, a fifth capacitor C5, and a third inductor L3;
wherein the fourth capacitor C4 is connected between the first output end of the first transformer T1 and a base of a first one of the third transistors Q3; the first transformer T1, the fourth capacitor C4, and the first one of the third transistors Q3 are connected in series; the fifth capacitor C5 is connected between the second output end of the first transformer T1 and a base of a second one of the third transistors Q3; the first transformer T1, the fifth capacitor C5, and the second one of the third transistors Q3 are connected in series; the third inductor L3 is connected between the second input end of the first transformer T1 and the power supply voltage Vcc2; the first transformer T1, the third inductor L3, and the power supply voltage Vcc2 are connected in series.

5. The differential power amplifier according to claim 2, wherein the output matching network further comprises a sixth capacitor C6, a seventh capacitor C7, an eighth capacitor C8, and a fourth inductor L4;
wherein a first end of the sixth capacitor C6 is connected with the first input end of the second transformer T2 and a first end of the seventh capacitor C7 is connected with the second input end of the second transformer T2; a second end of the sixth capacitor C6 and a second end of the seventh capacitor C7 are respectively grounded; a first end of the eighth capacitor C8 is connected with the first output end of the second transformer T2; a second end of the eighth capacitor C8 is grounded; the fourth inductor L4 is connected between the first output end of the second transformer T2 and a ground end; the second transformer T2, the fourth inductor L4, and the ground end are connected in series.

6. The differential power amplifier according to claim 1, wherein the input matching network comprises a ninth capacitor C9, a tenth capacitor C10, a fifth inductor L5, and a sixth inductor L6;
wherein a first end of the ninth capacitor C9 is connected with a first end of the fifth inductor L5, and a connection node thereof is configured to input the single-ended radio frequency input signal RFin; a second end of the fifth inductor L5 is grounded; a second end of the ninth capacitor C9 is connected with a first end of the tenth capacitor C10; a second end of the tenth capacitor C10 is connected with the input end of the first-stage amplification circuit; a first end of the sixth inductor L6 is connected between the ninth capacitor C9 and the tenth capacitor C10, and a second end of the sixth inductor L6 is grounded.

7. The differential power amplifier according to claim 1, wherein the second-stage amplification circuit further comprises a third resistor R3; the third resistor R3 is connected between the output end of the first inter-stage matching network and the input end of the second-stage amplification circuit; the first inter-stage matching network, the third resistor R3, and the second-stage amplification circuit are connected in series.

8. The differential power amplifier according to claim 2, wherein the differential power amplifier further comprises base bias circuits one-to-one connected with the base of the first transistor Q1, the base of the second transistor Q2, the base of the first one of the third transistors Q3, and the base of the second one of the third transistors Q3;
each of the base bias circuits comprises a fourth transistor Q4, a fifth transistor Q5, a sixth transistor Q6, a fourth resistor R4, a fifth resistor R5, a sixth resistor R6, and an eleventh capacitor C11;
in each of the base bias circuits, a base of the fourth transistor Q4 thereof, a collector of the fourth transistor Q4 thereof, a base of the fifth transistor Q5 thereof, a first end of the fourth resistor R4 thereof, and a first end of the eleventh capacitor C11 thereof are connected, a second end of the fourth resistance R4 thereof is connected with a power supply voltage Vreg, an emitter of the fourth transistor Q4 thereof, a base of the sixth transistor Q6 thereof, and a collector of the sixth transistor Q6 thereof are connected, an emitter of the sixth transistor Q6 thereof is connected with a first end of the fifth resistance R5 thereof, a second end of the fifth resistance R5 thereof is grounded, a second end of the eleventh capacitor C11 thereof is grounded, a collector of the fifth transistor Q5 thereof is connected with a power supply voltage Vbat thereof, an emitter of the fifth transistor Q5 thereof is connected with a first end of the sixth resistance R6 thereof, and a second end of the sixth resistance R6 thereof is connected with the base of a corresponding transistor.

9. The differential power amplifier according to claim 1, wherein the first inter-stage matching network comprises a seventh inductor L7, an eighth inductor L8, a fourteenth capacitor C14, and a fifteenth capacitor C15;
wherein a first end of the seventh inductor L7 and a first end of the fourteenth capacitor C14 are connected with the output end of the first-stage amplification circuit; a second end of the seventh inductor L7 is connected with a power supply voltage Vcc1; a second end of the fourteenth capacitor C14, a first end of the eighth inductor L8, and a first end of the fifteenth capacitor C15 are connected; a second end of the fifteenth capacitor C15 is connected with the input end of the second-stage amplification circuit; a second end of the eighth inductor L8 is grounded.

10. The differential power amplifier according to claim 1, wherein the first transformer T1 and the second transformer T2 are symmetrical interwinding transformers.

* * * * *